United States Patent
Linder et al.

(10) Patent No.: US 7,875,961 B2
(45) Date of Patent: Jan. 25, 2011

(54) SEMICONDUCTOR SUBSTRATE OF GAAS AND SEMICONDUCTOR DEVICE

(75) Inventors: Norbert Linder, Lappersdorf (DE); Günther Grönninger, Seubersdorf (DE); Peter Heidborn, Zeitlarn (DE); Klaus Streubel, Laaber (DE); Siegmar Kugler, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/621,854

(22) Filed: Nov. 19, 2009

(65) Prior Publication Data

US 2010/0065890 A1 Mar. 18, 2010

Related U.S. Application Data

(62) Division of application No. 11/541,089, filed on Sep. 28, 2006, now abandoned.

(30) Foreign Application Priority Data

Sep. 30, 2005 (DE) .................. 10 2005 046 943
Nov. 29, 2005 (DE) .................. 10 2005 056 950

(51) Int. Cl.
*H01L 21/02* (2006.01)
*H01L 29/66* (2006.01)
*H01L 31/102* (2006.01)
*H01L 33/00* (2006.01)

(52) U.S. Cl. .................. 257/657; 257/185; 257/655; 257/E33.003; 257/E21.002

(58) Field of Classification Search ............... 257/185, 257/657, 655, E33.003, E21.002
See application file for complete search history.

(56) References Cited

U.S. PATENT DOCUMENTS

| | | | |
|---|---|---|---|
| 4,616,241 A | 10/1986 | Biefeld et al. | |
| 5,656,829 A | 8/1997 | Sakaguchi et al. | |
| 5,665,985 A | 9/1997 | Iwata | |
| 6,057,592 A * | 5/2000 | Watanabe et al. | 257/657 |

(Continued)

FOREIGN PATENT DOCUMENTS

DE 195 31 762 A1 3/1996

(Continued)

OTHER PUBLICATIONS

H.K.H. Choy et al., "Room temperature Photoluminescence of MBE grown single quantum wells on InGaAs graded buffers", Conference on Lasers and Electro-Optics, CLEO, 2004.

(Continued)

*Primary Examiner*—Phat X Cao
*Assistant Examiner*—Diana C Garrity
(74) *Attorney, Agent, or Firm*—Cohen Pontani Lieberman & Pavane LLP

(57) ABSTRACT

A semiconductor substrate, of GaAs with a semiconductor layer sequence applied on top of the substrate. The semiconductor layer sequence comprises a plurality of semiconductor layers of $Al_{1-y}Ga_yAs_{1-x}P_x$ with $0 \leq x \leq 1$ and $0 \leq y \leq 1$. A number of the semiconductor layers respectively comprising a phosphorus component x which is greater than in a neighboring semiconductor layer lying thereunder in the direction of growth of the semiconductor layer sequence. Two semiconductor layers directly preceding the uppermost semiconductor layer of the semiconductor layer sequence have a smaller lattice constant than the uppermost layer.

16 Claims, 4 Drawing Sheets

U.S. PATENT DOCUMENTS

| | | | |
|---|---|---|---|
| 6,067,310 | A | 5/2000 | Hashimoto et al. |
| 6,171,394 | B1 * | 1/2001 | Watanabe et al. ............. 117/89 |
| 6,542,528 | B1 * | 4/2003 | Sato et al. ................ 372/45.01 |
| 6,639,249 | B2 | 10/2003 | Valliath |
| 6,825,500 | B1 | 11/2004 | Komaba |
| 6,927,412 | B2 * | 8/2005 | Takahashi et al. ............. 257/13 |
| 7,235,816 | B2 * | 6/2007 | Takahashi et al. ............. 257/94 |
| 7,317,202 | B2 | 1/2008 | Behres et al. |
| 2003/0036217 | A1 | 2/2003 | Richard et al. |
| 2003/0138015 | A1 | 7/2003 | Sato et al. |
| 2005/0116242 | A1 | 6/2005 | Behres et al. |
| 2005/0194593 | A1 | 9/2005 | Ramdani et al. |

FOREIGN PATENT DOCUMENTS

| | | |
|---|---|---|
| DE | 10 345 413 | 5/2005 |
| DE | 103 45 413 | 5/2005 |
| JP | 5-347431 | 12/1993 |
| JP | 2000-31592 | 1/2000 |
| JP | 2003-31592 | 1/2000 |

OTHER PUBLICATIONS

A.W. Bett et al., "Metamorphic GaInP-GaInAs Layers for Photovoltaic Applications", pp. 1-12.

R.R. King et al., "Metamorphic III-V Materials, Sublattice Disorder, and Multijunction Solar Cell Approaches With Over 37% Deficiency", 19$^{th}$ European Photovoltaic Solar Energy Conference, pp. 3586-3593, Paris, France, Jun. 7-11, 2004.

Nagano M et al., "Epitaxial growth and photoluminescence of AIAs/GaP short-period superlattices", Journal of Crystal Growth, Elsevier, Amsterdam, NL, Bd. 227-228, Nr. 1, Jul. 1, 2001 (4 pgs.).

Rusakova I A et al., "Stress analysis in strain compensated arsenide/phosphide superlattices grown by chemical beam epitaxy. Part 2", Microelectronics Journal, Mackintosh Publication Ltd., Luton, GB, Bd. 31, Nr. 5, May 1, 2000 (9 pgs.).

Tetsuo Soga et al., "Very low dislocation density GaAs on Si using superlattices grown by MOCVD", Journal of Crystal Growth, Elsevier, Amsterdam, NL, vol. 107, Nr. 1 / 04, Jan. 1, 1991 (4 pgs.).

Search Report dated Jul. 8, 2008 issued for the corresponding European Patent Application No. EP 06 01 9935 (6 pgs.).

* cited by examiner

SEMICONDUCTOR SUBSTRATE OF GAAS AND SEMICONDUCTOR DEVICE

CROSS-REFERENCE TO RELATED APPLICATIONS

This application is a divisional of U.S. patent application Ser. No. 11/541,089 which was filed with the U.S. Patent and Trademark Office on Sep. 28, 2006 which claims priority from German Applications Nos. 10 2005 046 943.4 filed Sep. 30, 2005 and 10 2005 056 950.1 filed Nov. 29, 2005. The entire disclosures of these applications are expressly incorporated herein by reference.

FIELD OF THE INVENTION

The invention relates to a semiconductor substrate of GaAs with a semiconductor layer sequence applied on top and to a semiconductor device with such a semiconductor substrate.

BACKGROUND OF THE INVENTION

For the production of electronic or optoelectronic semiconductor devices, it would be desirable to have substrates available with a cubic lattice structure and a lattice constant that lies between the lattice constants of GaAs and GaP. Such substrates could be used for the epitaxial growth of III-V semiconductor layers or II-VI semiconductor layers, in particular ternary or quaternary compounds, which have a lattice constant between those of GaAs and GaP and have not previously allowed themselves to be produced with adequate quality, or only by comparatively great expenditure on production.

However, elementary or binary semiconductor materials with a lattice constant that lies between those of GaAs and GaP are not known. Furthermore, ternary semiconductor compounds such as GaAsP or InAlGaP cannot be produced by the known crystal growing methods, or only with poor crystal quality directly as substrate materials.

One approach to solving this problem is to grow a comparatively thick buffer layer, for example of GaAsP, on a GaAs substrate, in order in this way to produce a quasi-substrate with a lower lattice constant than GaAs. In this case, however, comparatively great layer thicknesses of typically more than 10 µm are required in order to reduce the crystal defects, in particular dislocations, that are caused by the lattice mismatch between the substrate and the buffer layer in the direction of growth of the buffer layer in such a way that epitaxial growth of further semiconductor layers on the surface of the buffer layer is possible with adequate quality.

Furthermore, it has been found to be disadvantageous that a semiconductor wafer provided with such a buffer layer has comparatively great warpage, which is caused by incomplete relaxation of the buffer layer and the resultant layer stress.

SUMMARY OF THE INVENTION

One object of the present invention is to provide an improved quasi-substrate with a lattice constant which is lower than the lattice constant of GaAs, and a semiconductor device with such a quasi-substrate. In particular, the quasi-substrate is to be distinguished by comparatively high crystal quality, which permits the epitaxial growth of further semiconductor layers with a lower lattice constant than GaAs of high quality, and comparatively low expenditure on production.

This and other objects are attained in accordance with one aspect of the present invention directed to a semiconductor substrate of GaAs with a semiconductor layer sequence applied on top, wherein the semiconductor layer sequence contains a plurality of semiconductor layers of $Al_{1-y}Ga_yAs_{1-x}P_x$ with $0 \leq x \leq 1$ and $0 \leq y \leq 1$, a number of the semiconductor layers respectively having a phosphorus component x which is greater than in a neighboring semiconductor layer lying thereunder in the direction of growth of the semiconductor layer sequence.

It has been found that such a semiconductor layer sequence comprising a number of $Al_{1-y}Ga_yAs_{1-x}P_x$ layers applied to a semiconductor substrate of GaAs has comparatively high crystal quality. The fact that the phosphorus component x increases in the direction of growth of the semiconductor layer sequence at a number of interfaces between adjacent semiconductor layers means that it is more difficult for crystal defects, in particular dislocations, to spread over a number of semiconductor layers, and in this way the crystal quality is improved. In particular, it has been found that the spreading of dislocations is reduced by the abrupt changing of the phosphorus component and the associated abrupt changing of the lattice constant within the semiconductor layer sequence in comparison with buffer layers with a gradual or constant composition.

The uppermost layer of the semiconductor layer sequence advantageously has a lower lattice constant than the GaAs substrate. The GaAs substrate with the semiconductor layer sequence applied on top may be used in particular as a quasi-substrate for the epitaxial growth of further semiconductor layers which have a lower lattice constant than GaAs.

In particular, functional semiconductor layers suitable for radiation-detecting or radiation-emitting optoelectronic devices can be epitaxially grown on the quasi-substrate from III-V semiconductor materials or II-VI semiconductor materials with lower lattice constants than GaAs.

In a preferred embodiment of the invention, the phosphorus component x increases stage by stage in a number of successive semiconductor layers in the direction of growth of the semiconductor layer sequence. The semiconductor layer sequence therefore advantageously contains a number of adjacent semiconductor layers respectively with a fixed phosphorus component x, the phosphorus component x increasing step by step in the direction of growth from one semiconductor layer to the next-following respectively adjacent semiconductor layer. With particular preference, the phosphorus component x increases from one semiconductor layer to the respectively next-following semiconductor layer by the same amount. The number of successive semiconductor layers in which the phosphorus component x increases stage by stage is advantageously 4 or more. Furthermore, the number of semiconductor layers on which the phosphorus component x increases stage by stage is advantageously no more than 10.

Furthermore, the semiconductor layer sequence may include a superlattice structure comprising alternating first and second semiconductor layers of $Al_{1-y}Ga_yAs_{1-x}P_x$, the first semiconductor layers containing a phosphorus component $x_1 \geq 0$ and the second semiconductor layers containing a phosphorus component $x_2 \geq 0$ with $x_1 \neq x_2$. With such a superlattice structure as alternating layers with different phosphor components, the spreading of dislocations in the semiconductor layer sequence can be reduced particularly effectively.

It is particularly advantageous if the semiconductor layer sequence contains a number of semiconductor layers in which the phosphorus component x increases stage by stage, the semiconductor layers with a phosphorus component increasing stage by stage being followed by a superlattice structure comprising alternating first semiconductor layers with a phosphorus component $x_1$ and second semiconductor layers with a phosphorus component $x_2$.

For the phosphorus component x in the uppermost semiconductor layer of the semiconductor layer sequence, preferably $x \geq 0.15$. In this way it can be achieved in particular that the lattice constant in the uppermost semiconductor layer of the semiconductor layer sequence is lower by more than 0.5% than the lattice constant of GaAs. With particular preference, $x \geq 0.2$ for the phosphorus component x in the uppermost semiconductor layer of the semiconductor layer sequence, in order to achieve a lattice constant in the uppermost semiconductor layer that is lower by at least 0.7% in comparison with GaAs.

In a further preferred embodiment of the invention, 1-y=0 for the aluminum component 1-y in the semiconductor layer sequence. In this case, the semiconductor layer sequence is therefore based on $GaAs_{1-x}P_x$.

The semiconductor layer sequence according to the invention has in particular the advantage that a quasi-substrate with high crystal quality and low dislocation density can be produced with a comparatively small overall thickness of the semiconductor layer sequence. With particular preference, the overall thickness of the semiconductor layer sequence is 10 µm or less. The semiconductor layers of the semiconductor layer sequence preferably have a thickness of between 100 nm and 1000 nm, inclusive.

A semiconductor device according to an embodiment of the invention contains a semiconductor substrate with a semiconductor layer sequence applied on top according to one of the previously described advantageous refinements.

In particular, the semiconductor device may be an optoelectronic device, for example a luminescence diode or a semiconductor laser.

The optoelectronic device contains in particular a radiation-detecting or radiation-emitting active layer. The radiation-detecting or radiation-emitting active layer may be included in a further semiconductor layer sequence, which is epitaxially grown on the semiconductor layer sequence applied to the substrate. In this case, the GaAs substrate with the semiconductor layer sequence applied on top therefore acts as a quasi-substrate for the further semiconductor layer sequence which contains the functional semiconductor layers of the optoelectronic device, in particular a radiation-emitting or radiation-detecting layer.

The radiation-detecting or radiation-emitting layer may contain in particular $In_xAl_yGa_{1-x-y}P$ with $0 \leq x < 0.5$, $0 \leq y \leq 1$ and $x+y \leq 1$. Alternatively, it is also possible that the radiation-detecting or radiation-emitting layer contains one of the semiconductor materials ZnSe, ZnSSe, ZnMgSSe, MgS, GaAsN or InGaAsN.

The semiconductor layers of the semiconductor layer sequence are preferably metamorphic semiconductor layers. This means in particular that the semiconductor layers grow at least virtually stress-free on the GaAs substrate or the semiconductor layer respectively lying thereunder. For this purpose, the semiconductor layers are preferably grown at a temperature of 700° C. or less, for example in the range between 450° C. and 700° C.

Layer stresses caused by the different lattice constants of the semiconductor layers and/or the GaAs substrate are largely avoided by the metamorphic growth of the semiconductor layers. Warpage of the semiconductor substrate that otherwise occurs as result of layer stresses is reduced as a result.

At least one of the semiconductor layers, in particular the uppermost semiconductor layer, is preferably relaxed.

It has been found that the relaxation of the uppermost semiconductor layer can be encouraged by at least one of the semiconductor layers lying thereunder having a lower lattice constant. In the case of a preferred embodiment, the uppermost semiconductor layer of the semiconductor layer sequence has a lower lattice constant than the two semiconductor layers directly preceding it.

DETAILED DESCRIPTION OF THE DRAWINGS

Figure 1A:
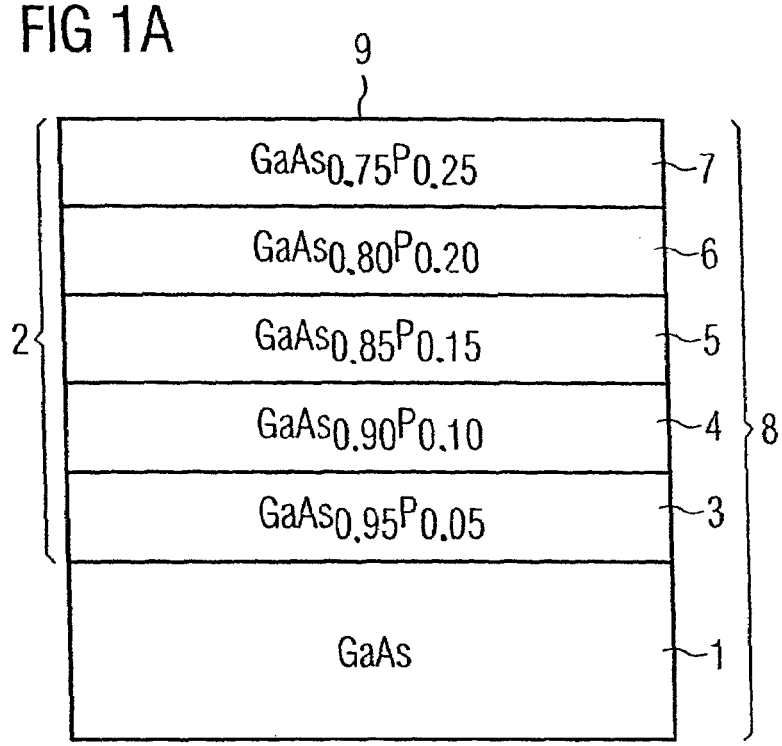
FIG. 1A shows a schematic representation of a cross section through a semiconductor substrate with a semiconductor layer sequence applied on top according to a first exemplary embodiment of the invention.

Elements that are the same or have the same effect are provided with the same reference numerals in the figures. The elements represented are not to be regarded as true to scale; rather, some elements may be shown exaggerated for better understanding.

Applied on top of the semiconductor substrate 1 of GaAs that is schematically represented in cross section in FIG. 1 is a semiconductor layer sequence 2, which comprises a number of GaAsP layers. Starting from the GaAs substrate, the semiconductor layer sequence 2 contains a $GaAs_{0.95}P_{0.05}$ layer 3, a $GaAs_{0.90}P_{0.10}$ layer 4, a $GaAs_{0.85}P_{0.15}$ layer 5, a $GaAs_{0.80}P_{0.20}$ layer 6 and a $GaAs_{0.75}P_{0.25}$ layer 7. Altogether, the semiconductor layer sequence 2 therefore contains five semiconductor layers 3, 4, 5, 6, 7 of $GaAs_{1-x}P_x$, the phosphorus component x increasing stage by stage from a value of x=0.05 in the semiconductor layer 3 adjacent the GaAs substrate 1 to a value of x=0.25 in the uppermost semiconductor layer 7. The phosphorus component of the semiconductor layers thereby increases in comparison with the semiconductor layer respectively lying thereunder by an amount of $\Delta x = 0.05$.

The semiconductor substrate 1 of GaAs with the layer sequence 2 applied on top represents a quasi-substrate 8, on the surface 9 of which further semi-conductor layers or semiconductor layer sequences in particular can be grown. In particular, semiconductor layers which have a lower lattice constant than GaAs can be epitaxially grown on the surface 9 of the quasi-substrate 8. This is advantageously possible, since the uppermost semiconductor layer 7 has a lower lattice constant than the GaAs substrate 1 because of its phosphorus component.

Figure 1B:
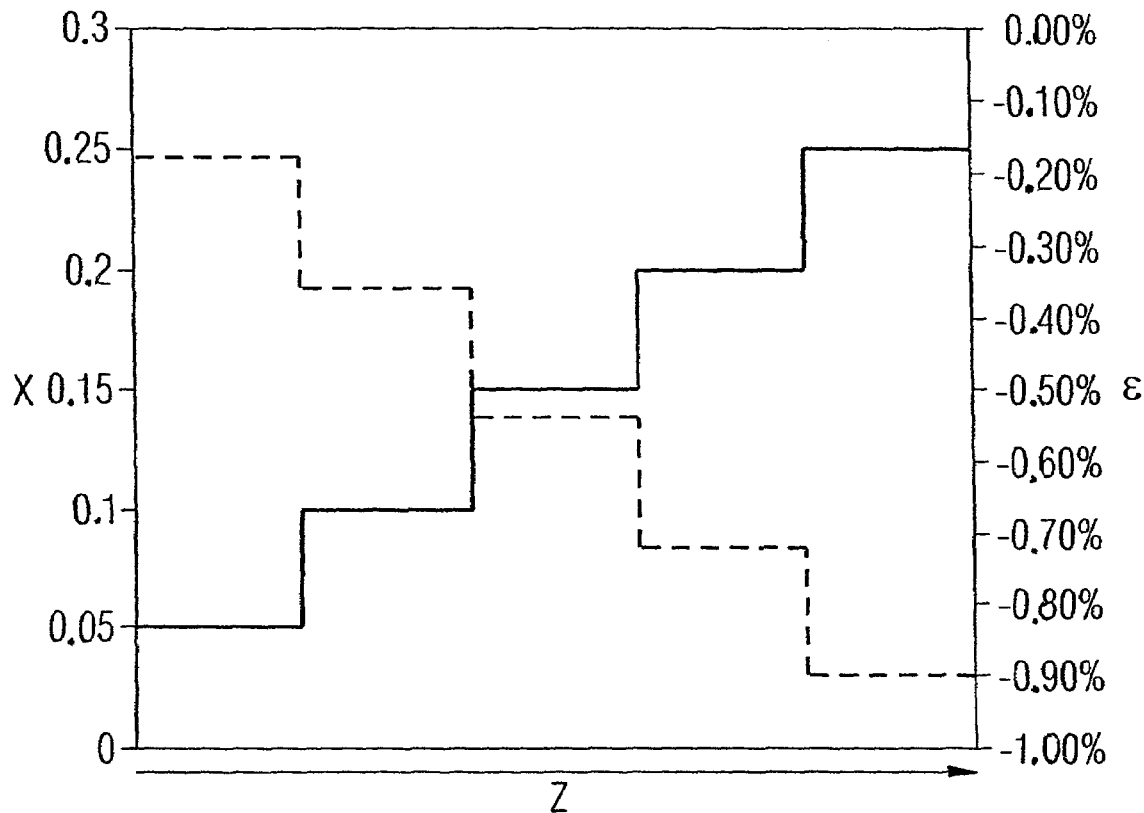
FIG. 1B shows a graphic representation of the phosphorus component x and the relative change $\epsilon$ of the lattice constant in dependence on a space coordinate z in the case of a first exemplary embodiment.

The relationship between the phosphorus component x and the lattice constant of the $GaAs_{1-x}P_x$ semiconductor layers is explained in more detail in FIG. 1B, in which the variation of the phosphorus component x and the relative change of the lattice constant $\epsilon=(d-d_0)/d_0$ in dependence on a space coordinate z originating from the substrate 1 and extending in the direction of growth of the semiconductor layer sequence is represented. In this case, $d_0$ is the lattice constant of the GaAS substrate 1 and d is the lattice constant of the respective $GaAs_{1-x}P_x$ layer.

The staged increase in the phosphorus component x (solid line) in the semiconductor layer sequence leads to a staged reduction of the lattice constant d.

For example, a reduction of the lattice constant d in comparison with the lattice constant $d_0$ of the GaAs substrate 1 by approximately 0.9% is achieved by the increase of the phosphorus component x to a value of x=0.25 in the uppermost semiconductor layer 7.

Figure 2A:
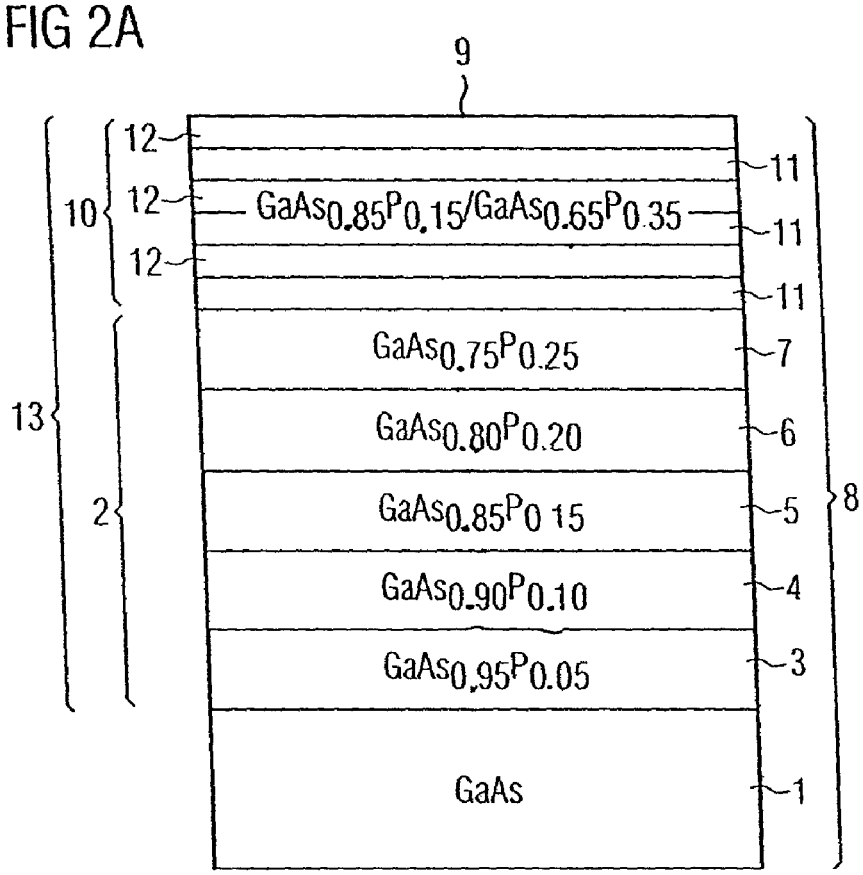
FIG. 2A shows a schematic representation of a cross section through a semiconductor substrate with a semiconductor layer sequence applied on top according to a second exemplary embodiment of the invention.

In the case of the semiconductor substrate 1 that is schematically represented in cross section in FIG. 2A, with a semiconductor layer sequence 13 according to a second exemplary embodiment of the invention applied on top, arranged on the GaAs substrate 1, as in the case of the first exemplary embodiment, are five semiconductor layers 3, 4, 5, 6, 7, in which the phosphorus component increases stage by stage from x=0.05 to x=0.25. On the semiconductor layers 3, 4, 5, 6, 7 with the staged increase in the phosphorus component is a superlattice structure 10, which contains three pairs of layers respectively comprising a first semiconductor layer 11 of $GaAs_{0.85}P_{0.15}$ and a second semiconductor layer 12 of $GaAs_{0.65}P_{0.35}$. The superlattice structure 10 that is additionally included in the semiconductor layer sequence 13 in comparison with the first exemplary embodiment has the effect of achieving a still better reduction in the spread of dislocations, and consequently a further improvement of the crystal quality of the surface 9 of the semiconductor layer sequence 13, and consequently a further improved quasi-substrate 8.

Figure 2B:
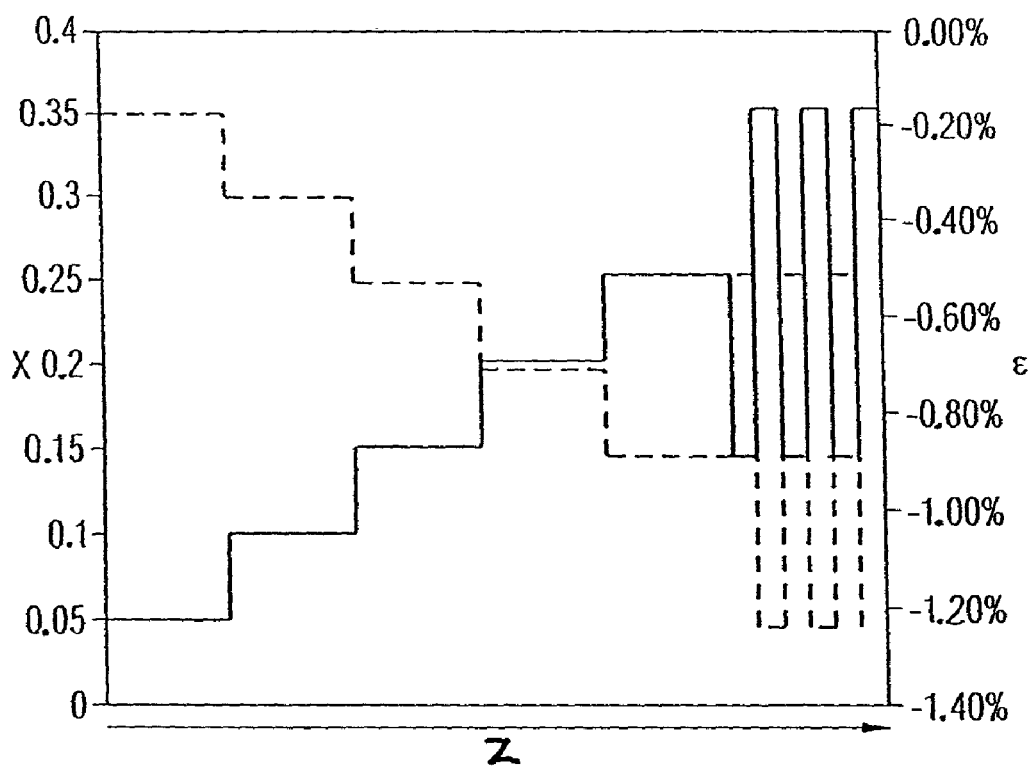
FIG. 2B shows a graphic representation of the phosphorus component x and the relative change $\epsilon$ of the lattice constant in dependence on a space coordinate z in the case of a second exemplary embodiment.

The variation of the phosphorus component x and the relative change of the lattice constants $\epsilon$ in dependence on a space coordinate z originating from the substrate in the case of the second exemplary embodiment of the invention is represented in FIG. 2B.

Figure 3A:
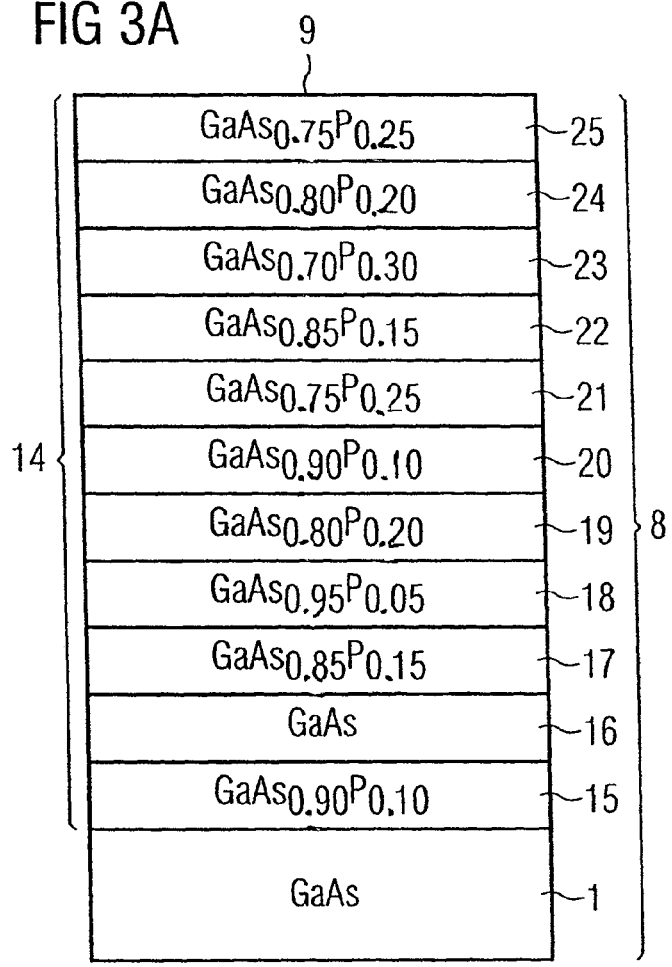
FIG. 3A shows a schematic, representation of a cross section through a semiconductor substrate with a semiconductor layer sequence applied on top according to a third exemplary embodiment of the invention.

A further exemplary embodiment of a semiconductor substrate with a semiconductor layer sequence according to the invention applied on top is schematically represented in cross section in FIG. 3A. In the case of this exemplary embodiment, a semiconductor layer sequence 14 which contains a total of 11 semiconductor layers is applied to a GaAs substrate 1. Starting from the GaAs substrate 1, the semiconductor layer sequence 14 contains a $GaAs_{0.90}P_{0.10}$ layer 15, a GaAs layer 16, a $GaAe_{0.85}P_{0.15}$ layer 17, a $GaAs_{0.95}P_{0.05}$ layer 18, a $GaAs_{0.08}P_{0.20}$ layer 19, a $GaAs_{0.90}P_{0.10}$ layer 20, a $GaAs_{0.75}P_{0.25}$ layer 21, a $GaAs_{0.85}P_{0.15}$ layer 22, a $GaAs_{0.70}P_{0.30}$ layer 23, a $GaAs_{0.80}P_{0.20}$ layer 24 and a $GaAs_{0.75}P_{0.25}$ layer 25.

Figure 3B:
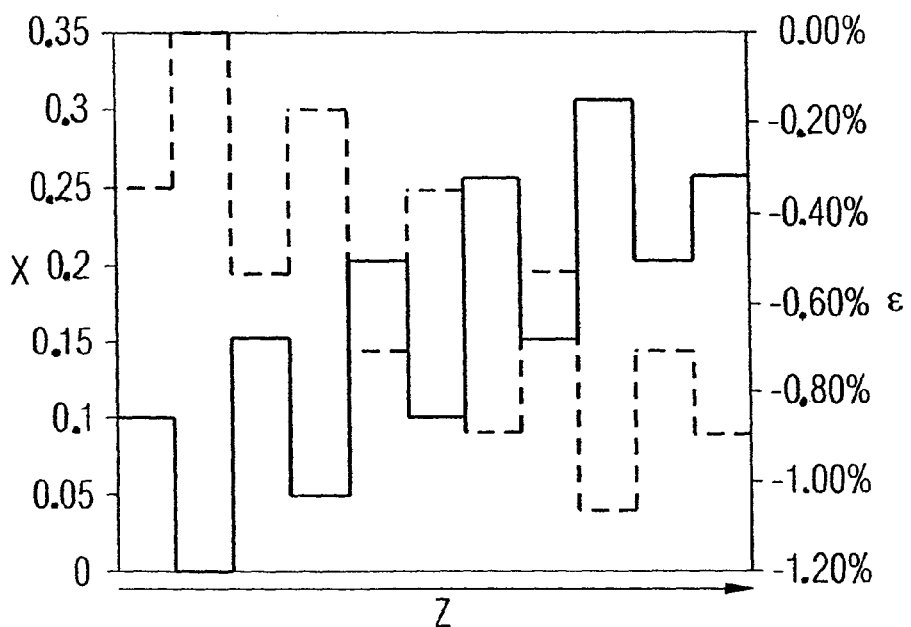
FIG. 3B shows a graphic representation of the phosphorus component x and the relative change $\epsilon$ of the lattice constant in dependence on a space coordinate z in the case of a third exemplary embodiment.

The variation of the phosphorus component x and the relative change of the lattice constants $\epsilon$ in dependence on a space coordinate z originating from the substrate 1 that is schematically represented in FIG. 3B illustrates that the phosphorus component x in the semiconductor layer sequence 14 is increased step by step to a value of x=0.25 in the uppermost semiconductor layer 25, although, by contrast with the first exemplary embodiment, the phosphorus component is not greater in every semiconductor layer than in the semiconductor layer lying thereunder in the direction of growth, but in a number of semiconductor layers it is even smaller than in the semiconductor layer lying thereunder in the direction of growth. The variation of the phosphorus component in the semiconductor layer sequence 14 therefore corresponds to a superlattice structure comprising alternating first semiconductor layers and second semiconductor layers in which the phosphorus component of the first semiconductor layer and of the second semiconductor layer in the case of each pair of layers is respectively increased in comparison with the pair of layers lying thereunder. In this embodiment, the composition of the semiconductor layer changes in a staged manner at a plurality of interfaces, like in the layer sequence of the first embodiment, thereby reducing the number of crystal defects. The changes of composition are advantageously more abrupt than in the first embodiment, like in the superlattice layer of the second embodiment. In this way, the advantageous properties of the staged increase of the phosphorus component in the case of the first exemplary embodiment and of the superlattice structure in the case of the second exemplary embodiment, in particular with regard to the reduction in the spread of dislocations, are combined with each other in a single semiconductor layer sequence 14.

Figure 4:
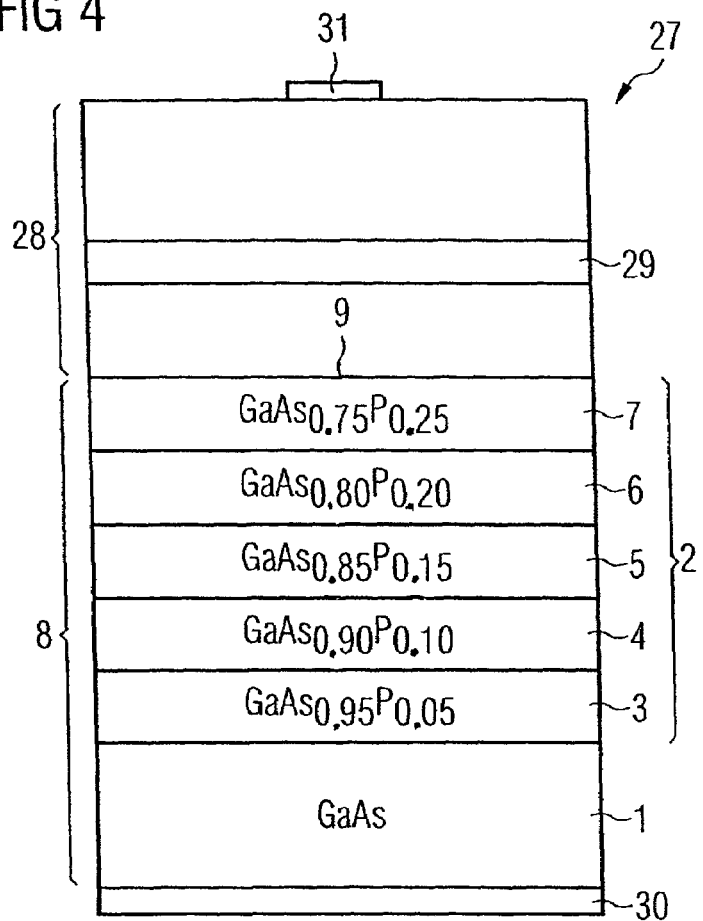
FIG. 4 shows a schematic representation of a cross section through an exemplary embodiment of a semiconductor device according to the invention.

In FIG. 4, an exemplary embodiment of a semiconductor device according to the invention is schematically represented in cross section. The semiconductor device 27 is a luminescence diode, which contains a GaAs substrate 1 with a semiconductor layer sequence 2 applied on top.

The structure of the semiconductor layer sequence 2 is the same as in the case of the previously described first exemplary embodiment, i.e. the semiconductor layer sequence 2 contains five semiconductor layers 3, 4, 5, 6, 7 of $GaAs_{1-x}P_x$, the phosphorus component x increasing stage by stage from a value of x=0.05 in the semiconductor layer 3 adjacent the GaAs substrate 1 to a value of x=0.25 in the uppermost semiconductor layer 7.

The GaAs substrate 1 with the semiconductor layer sequence 2 applied on top represents a quasi-substrate 8, on the surface 9 of which a further semiconductor layer sequence 28 is epitaxially grown. The semiconductor layer sequence 28 is based on a semiconductor material which has a lower lattice constant than GaAs.

Included in the semi-conductor layer sequence 28 is a radiation-emitting active layer 29, which for example contains $In_xGa_yAl_{1-x-1}P$ with $0<x<0.5$, $0 \leq y \leq 1$ and $x+y \leq 1$.

Alternatively, the radiation-emitting active layer 29 contains for example one of the semiconductor materials ZnSSe, ZnMgSSe, GaAsN or InGaAsN.

For the electrical contacting of the luminescence diode, for example a first electrical contact layer 30 may be provided on the rear side of the substrate 1, facing away from the semiconductor layer sequence 2, and a second electrical contact layer 31 may be provided on the surface of the semiconductor layer sequence 28 facing away from the substrate 1.

Figure 5:
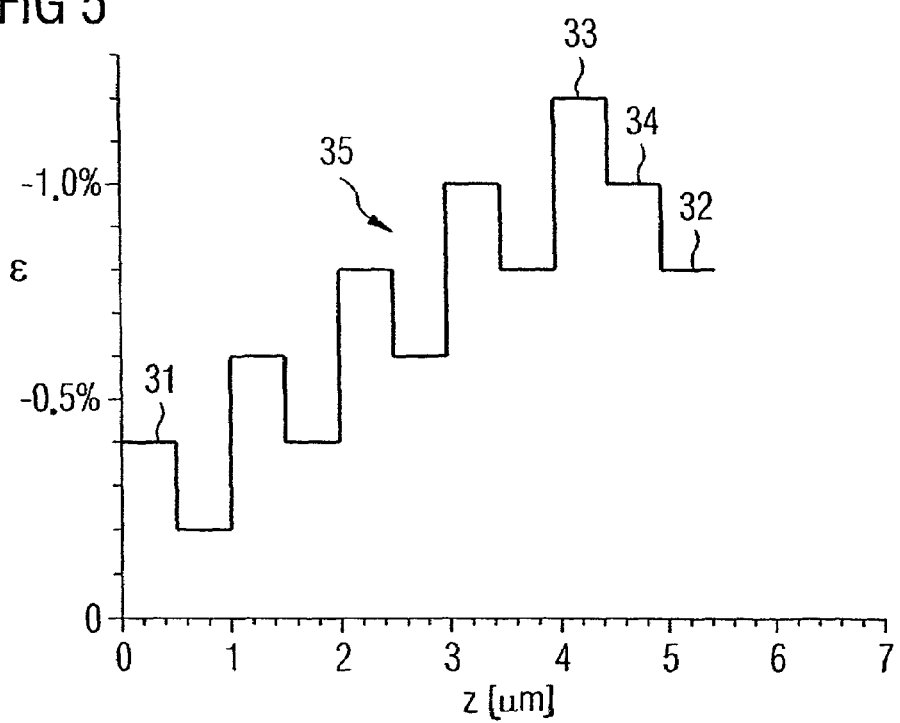
FIG. 5 shows a graphic representation of the relative change $\epsilon$ of the lattice constant in dependence on a space coordinate z in the case of a further exemplary embodiment of the invention.

In FIG. 5, the variation of the relative change of the lattice constant $\epsilon$ in dependence on a space coordinate z originating from a semiconductor substrate is represented. In the case of this exemplary embodiment, a semiconductor layer sequence 35 with a total of 11 semiconductor layers is applied to the semiconductor substrate to produce a quasi-substrate. The layer 31 adjacent the substrate has with respect to the substrate a lattice mismatch of −0.4%. The surface of the uppermost semiconductor layer 32 acts as a quasi-substrate, with $\epsilon=-0.8\%$ in the uppermost semiconductor layer. The change of $\epsilon$ takes place in the semiconductor layer sequence 35 stage by stage up to $\epsilon=-1.2\%$ in the 9th layer 33.

The two layers 33, 34 preceding the uppermost semiconductor layer therefore respectively have a lower lattice constant than the uppermost semiconductor layer 32, provided as a quasi-substrate. Such overcompensation of the lattice constant in the layers 33, 34 preceding the uppermost semiconductor layer 32 encourages the complete relaxation of the uppermost semiconductor layer 32 before further layers, for example an LED layer sequence, are applied to the uppermost semiconductor layer 32 acting as a quasi-substrate.

The invention is not restricted by the description on the basis of the exemplary embodiments. Rather, the invention comprises any novel feature and any combination of features, which includes in particular any combination of features in the patent claims, even if this feature or this combination itself is not explicitly specified in the patent claims or exemplary embodiments.

We claim:

1. A semiconductor substrate of GaAs with a semiconductor layer sequence applied on top of the substrate, the semiconductor layer sequence comprising a plurality of semiconductor layers of $Al_{1-y}Ga_yAs_{1-x}P_x$ with $0 \leq x \leq 1$ and $0 \leq y \leq 1$, a number of the semiconductor layers respectively comprising a phosphorus component x which is greater than in a neighboring semiconductor layer lying thereunder in the direction of growth of the semiconductor layer sequence, wherein two semiconductor layers directly preceding the uppermost semiconductor layer of the semiconductor layer sequence have a smaller lattice constant than the uppermost layer.

2. The semiconductor substrate as claimed in claim 1, wherein the phosphorus component x increases stage by stage in at least 3 successive semiconductor layers of the semiconductor layer sequence.

3. The semiconductor substrate as claimed in claim 1, wherein, for the phosphorus component x in the uppermost semiconductor layer of the semiconductor layer sequence, $x \geq 0.15$.

4. The semiconductor substrate as claimed in claim 1, wherein, for the aluminum component 1-y in the semiconductor layer sequence, 1-y=0.

5. The semiconductor substrate as claimed in claim 1, wherein the overall thickness of the semiconductor layer sequence is 10 μm or less.

6. The semiconductor substrate as claimed in claim 1, wherein the semiconductor layers have a thickness of between 100 nm and 1000 nm, inclusive.

7. The semiconductor substrate as claimed in claim 1, wherein at least one semiconductor layer of the semiconductor layer sequence is relaxed.

8. The semiconductor substrate as claimed in claim 7, wherein the uppermost semiconductor layer of the semiconductor layer sequence is relaxed.

9. A semiconductor device, wherein the semiconductor device comprises a GaAs substrate with a semiconductor layer sequence as claimed in claim 1 applied on top of the substrate.

10. The semiconductor device as claimed in claim 9, wherein the semiconductor device is an optoelectronic device.

11. The semiconductor device as claimed in claim 10, wherein the optoelectronic device is a luminescence diode or a semiconductor laser.

12. The semiconductor device as claimed in claim 10, wherein the optoelectronic device contains a radiation-detecting or radiation-emitting layer.

13. The semiconductor device as claimed in claim 12, wherein the radiation-detecting or radiation-emitting layer contains $In_xAl_yGa_{1-x-y}P$ with $0 \leq x < 0.5$, $0 \leq y \leq 1$ and $x+y \leq 1$.

14. The semiconductor device as claimed in claim 12, wherein the radiation-detecting or radiation-emitting layer contains ZnSSe or ZnMgSSe.

15. The semiconductor device as claimed in claim 12, wherein the radiation-detecting or radiation-emitting layer contains GaAsN or InGaAsN.

16. The semiconductor device as claimed in claim 12, wherein the radiation-detecting or radiation-emitting layer is included in a further semiconductor layer sequence, which is epitaxially grown on the semiconductor layer sequence.

* * * * *